(12) United States Patent
Mann

(10) Patent No.: US 11,923,711 B2
(45) Date of Patent: Mar. 5, 2024

(54) POWER MANAGEMENT FOR HYBRID POWER SYSTEM

(71) Applicant: AMOGY Inc., Brooklyn, NY (US)

(72) Inventor: Maxwell Spencer Mann, Helsinki (FI)

(73) Assignee: AMOGY INC., Brooklyn, NY (US)

( * ) Notice: Subject to any disclaimer, the term of this patent is extended or adjusted under 35 U.S.C. 154(b) by 0 days.

(21) Appl. No.: 17/501,090

(22) Filed: Oct. 14, 2021

(65) Prior Publication Data

US 2023/0123946 A1    Apr. 20, 2023

(51) Int. Cl.
*H02J 7/00* (2006.01)
*H03F 3/45* (2006.01)
*H03K 3/86* (2006.01)

(52) U.S. Cl.
CPC .......... *H02J 7/0068* (2013.01); *H02J 7/0048* (2020.01); *H03F 3/45475* (2013.01); *H03K 3/86* (2013.01)

(58) Field of Classification Search
CPC ... H02J 7/0068; H02J 7/0048; H03F 3/45475; H03K 3/86
See application file for complete search history.

(56) References Cited

U.S. PATENT DOCUMENTS

| | | | |
|---|---|---|---|
| 7,220,699 B2 | 5/2007 | Chellappa | |
| 7,439,273 B2 | 10/2008 | Woods et al. | |
| 7,662,435 B2 | 2/2010 | Chellappa et al. | |
| 7,670,587 B2 | 3/2010 | Porter et al. | |
| 7,731,918 B2 | 6/2010 | Chellappa | |
| 7,763,086 B2 | 7/2010 | Woods et al. | |
| 8,617,265 B2 | 12/2013 | Chellappa | |
| 8,754,545 B2 * | 6/2014 | Wai | H02J 7/345 307/66 |
| 9,099,938 B2 * | 8/2015 | Ilic | H02M 1/36 |

(Continued)

FOREIGN PATENT DOCUMENTS

| | | | | |
|---|---|---|---|---|
| CN | 103283111 A | * | 9/2013 | .......... B60L 11/1855 |
| CN | 204119031 U | * | 1/2015 | |

(Continued)

OTHER PUBLICATIONS

Co-pending U.S. Appl. No. 17/974,885, inventors Jo; Young Suk et al., filed Oct. 27, 2022.

(Continued)

*Primary Examiner* — Metasebia T Retebo
*Assistant Examiner* — James G Yeaman
(74) *Attorney, Agent, or Firm* — Wilson Sonsini Goodrich & Rosati

(57) ABSTRACT

A system comprises a positive voltage supply node and a negative voltage supply node configured for connection to a load, a power source coupled between the positive voltage supply node and the negative voltage supply node, an energy storage device, a solid-state switch, and a control system. The energy storage device and the solid-state switch are connected in series between the positive voltage supply node and the negative voltage supply node. The control system is configured to control activation and deactivation of the solid-state switch to (i) allow the energy storage device to be discharged and supply power to a load, and to (ii) modulate an amount of charging current that flows through the energy storage device from the power source (or load) to recharge the energy storage device.

20 Claims, 9 Drawing Sheets

(56) References Cited

U.S. PATENT DOCUMENTS

| | | | |
|---|---|---|---|
| 9,780,567 B2 * | 10/2017 | Hunt | H02J 7/02 |
| 10,566,802 B2 * | 2/2020 | Hunt | H02J 5/00 |
| 10,826,268 B1 * | 11/2020 | Zamprogno | H03K 17/102 |
| 11,465,114 B2 | 10/2022 | Jo et al. | |
| 11,539,063 B1 | 12/2022 | Choi et al. | |
| 2005/0237040 A1 * | 10/2005 | Rice | H02M 3/1584 323/282 |
| 2011/0279096 A1 * | 11/2011 | Sonntag | H02J 7/34 320/166 |
| 2012/0026761 A1 * | 2/2012 | Young | H02M 7/125 318/494 |
| 2012/0153858 A1 * | 6/2012 | Melanson | H02M 3/33523 363/21.13 |
| 2016/0276848 A1 * | 9/2016 | Maltsev | H02J 7/0016 |
| 2019/0149137 A1 * | 5/2019 | Jin | H03K 7/08 332/109 |
| 2021/0155224 A1 * | 5/2021 | McKibben | B60L 58/40 |
| 2021/0175797 A1 * | 6/2021 | Chan | H02M 3/158 |
| 2021/0190833 A1 * | 6/2021 | Roberts | H02P 6/28 |
| 2022/0347644 A1 | 11/2022 | Jo et al. | |
| 2022/0362748 A1 | 11/2022 | Jo et al. | |
| 2022/0364505 A1 | 11/2022 | Kim et al. | |
| 2022/0389864 A1 | 12/2022 | Jo et al. | |
| 2022/0395810 A1 | 12/2022 | Sheludko et al. | |
| 2022/0395812 A1 | 12/2022 | Sheludko et al. | |
| 2022/0403775 A1 | 12/2022 | Jo et al. | |
| 2023/0001377 A1 | 1/2023 | Jo et al. | |
| 2023/0053230 A1 | 2/2023 | Jo et al. | |
| 2023/0053549 A1 | 2/2023 | Choi et al. | |
| 2023/0055180 A1 | 2/2023 | Choi et al. | |
| 2023/0055949 A1 | 2/2023 | Choi et al. | |
| 2023/0118083 A1 | 4/2023 | Jo et al. | |

FOREIGN PATENT DOCUMENTS

| | | | | |
|---|---|---|---|---|
| CN | 204506587 U | * | 7/2015 | |
| CN | 105226786 A | * | 1/2016 | |
| CN | 103929048 B | * | 4/2016 | |
| CN | 106787079 A | * | 5/2017 | |
| CN | 104185350 B | * | 9/2017 | |
| CN | 105932344 B | * | 6/2018 | |
| CN | 110829838 A | * | 2/2020 | H02M 3/1582 |
| CN | 112187077 A | * | 1/2021 | |
| DE | 102014007304 A1 | * | 1/2015 | B60L 11/1855 |
| DE | 102018217160 A1 | * | 4/2020 | |
| EP | 0750389 A2 | * | 12/1996 | |
| ES | 2743599 T3 | * | 2/2020 | G04F 1/005 |
| JP | H06205537 A | * | 7/1994 | |
| JP | H06205537 A | * | 7/1994 | |
| JP | 2012065032 A | * | 3/2012 | H03K 17/163 |
| JP | 2018105621 A | * | 7/2018 | |
| KR | 102159264 B1 | * | 11/2008 | |
| KR | 102159264 B1 | * | 11/2018 | |
| NL | 8002726 A | * | 11/1980 | G04F 1/005 |
| RU | 2699374 C1 | | 9/2019 | |
| WO | WO-2005099885 A1 | | 10/2005 | |
| WO | WO-2016052163 A1 | * | 4/2016 | H02J 7/0019 |
| WO | WO-2021225254 A1 | | 11/2021 | |
| WO | WO-2022010178 A1 | | 1/2022 | |
| WO | WO-2022241260 A1 | | 11/2022 | |
| WO | WO-2022261488 A1 | | 12/2022 | |
| WO | WO-2023022995 A1 | | 2/2023 | |

OTHER PUBLICATIONS

Co-pending U.S. Appl. No. 17/974,997, inventors Jo; Young Suk et al., filed Oct. 27, 2022.

Co-pending U.S. Appl. No. 17/975,184, inventors Jo; Young Suk et al., filed Oct. 27, 2022.

Co-pending U.S. Appl. No. 18/065,915, inventors Sheludko; Boris et al., filed Dec. 14, 2022.

Co-pending U.S. Appl. No. 18/066,163, inventors Sheludko; Boris et al., filed Dec. 14, 2022.

Co-pending U.S. Appl. No. 18/133,388, inventors Sheludko; Boris et al., filed Apr. 11, 2023.

* cited by examiner

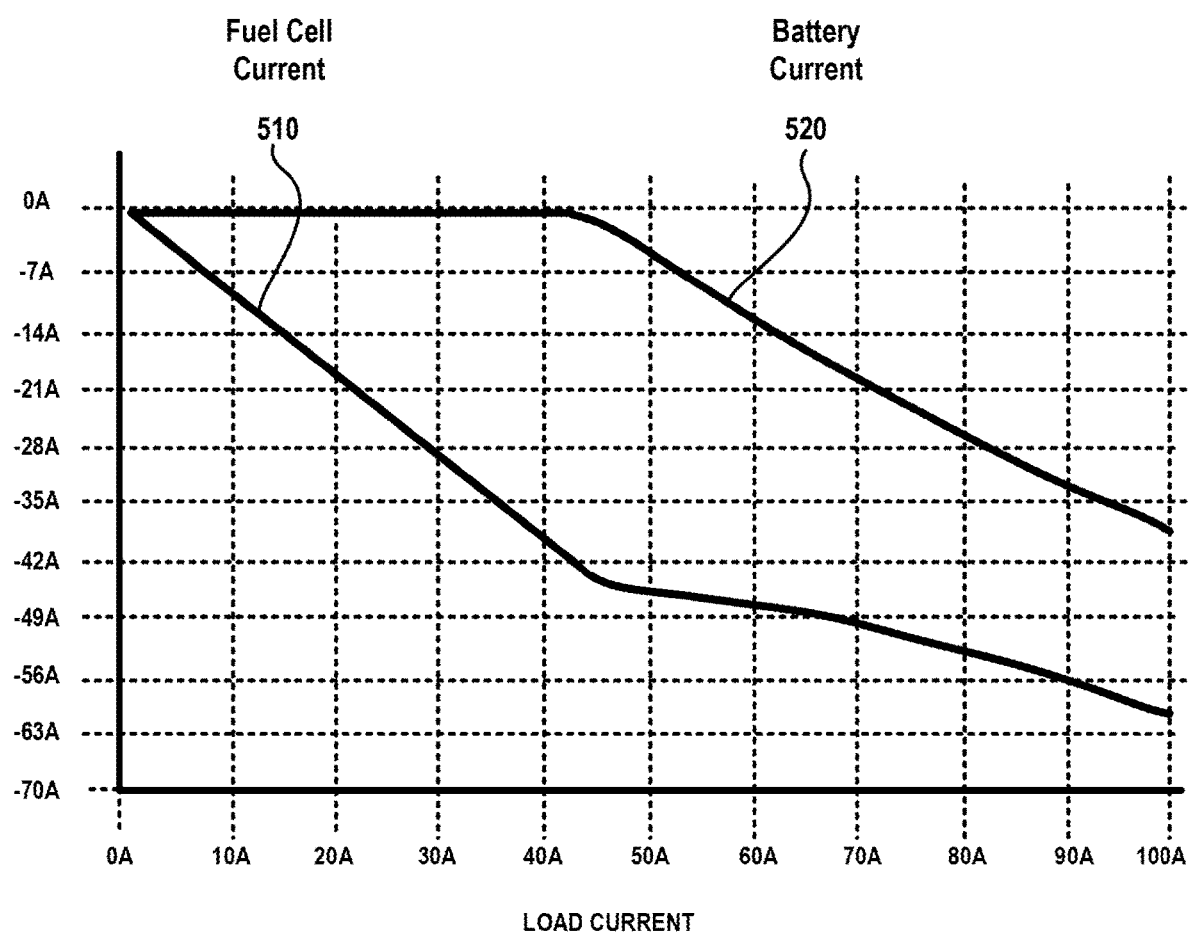

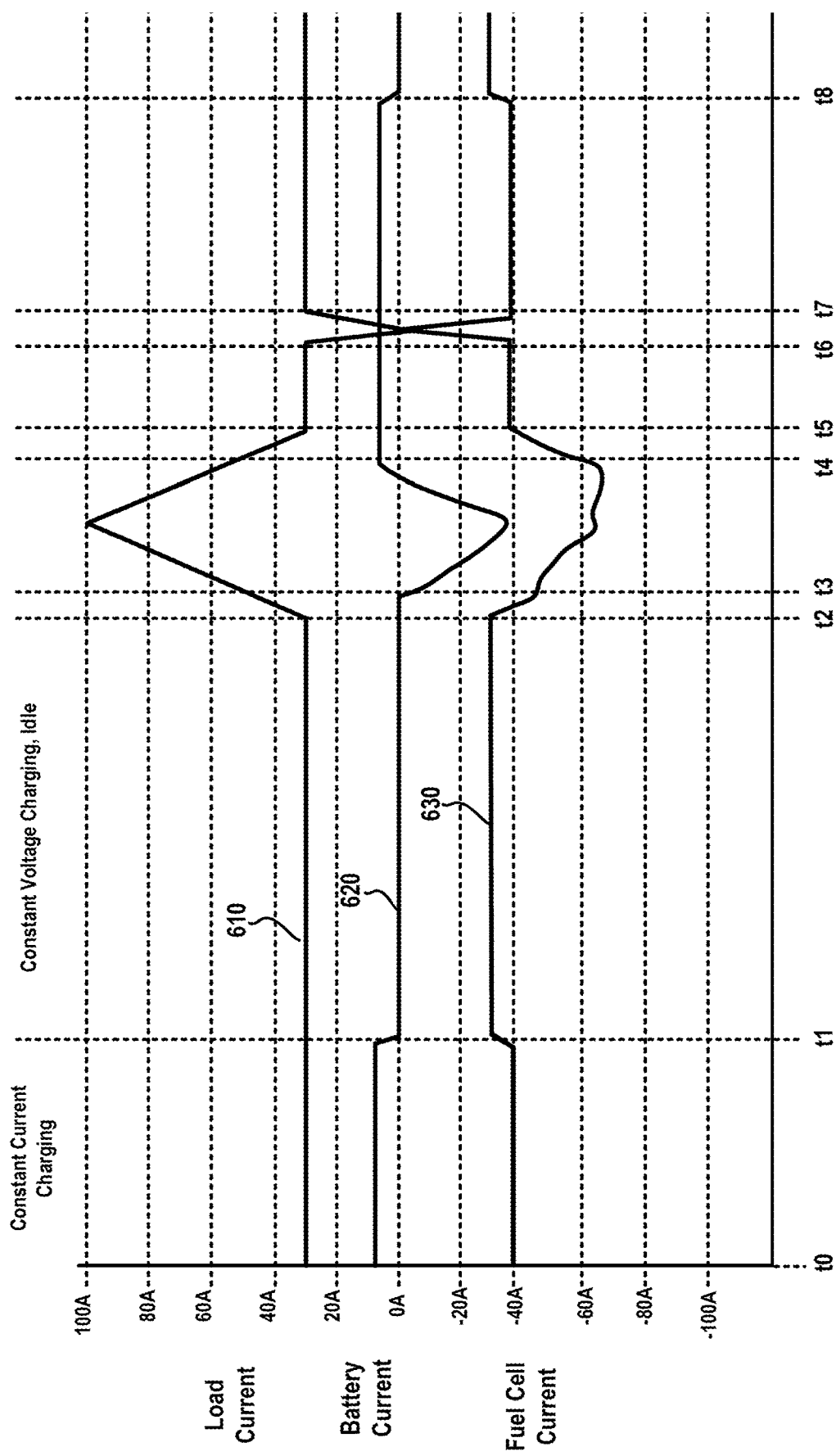

POWER MANAGEMENT FOR HYBRID POWER SYSTEM

BACKGROUND

This disclosure relates generally to systems and methods for generating and regulating direct current (DC) power for electric loads. There are concerted efforts to reduce greenhouse-gas emissions and protect against climate change. Such efforts currently include continuing research and development with regard to renewable energy sources for electric power generation systems. For example, renewable energy sources for electric power generation systems include fuel cells (e.g., hydrogen fuel cells), solar cells, wind turbines, etc. In particular, electrical power for an electric engine or motor can be generated using hydrogen fuel cell which combines hydrogen and oxygen to produce electricity, heat, and water.

The electrical power output of renewable energy sources such as fuel cells, solar cells, and wind turbines, etc., depends not only on the availability of fuel, sunlight, wind, etc. but also on the load impedance. If the load impedance is too low or too high, the energy source will produce less power. Moreover, connecting a fuel cell to a very low impedance load causes permanent damage to the fuel cell, as the voltage of one or more cells invert, causing damaging electrochemical reactions. To deliver maximum power into a load of arbitrary impedance, electric power generation systems typically utilize high-power DC-DC converters (also referred to as DC-DC boost converters) which raise or lower the energy source's voltage to regulate the power that flows to a load. For example, fuel cell and solar cell systems are typically designed to generate a lower voltage, and a high-power DC-DC converter is typically utilized to increase the voltage to higher levels to power loads requiring higher voltage. In addition, a high-power DC-DC converter is required even when renewable energy systems are designed to output high voltage, because the renewable energy system voltage often decreases as its power output increases. For example, a typical fuel cell voltage output (at no load) can drop 50% or more at full load. Consequently, a renewable energy source, such as fuel cell, typically provides a limited voltage and current density (depending upon the load) to the high-power DC-DC power converter, wherein the high-power DC-DC power converter is configured to adjust the voltage output of the fuel cell to a voltage that is high enough to operate the load.

While a high-power DC-DC converter is useful in controlling and regulating power that generated by a renewable power source and delivered to a load, there are significant implementation issues associated with high-power DC-DC converters for designing power pack system for certain applications, such as power mobility applications (e.g., multirotor drones). For example, a high-power DC-DC converter adds significant weight to the power pack system. In addition, the high-power DC-DC converter generates a significant amount of heat during operation, which requires a thermal management system which comprises components such as heat sinks and cooling fans. In this regard, the components needed for thermal management system can add significant weight to the power pack system, and increase the power usage of the power pack system to operate components (e.g., cooling fans) of the thermal management system.

SUMMARY

Embodiments of the disclosure include hybrid power systems, and systems and methods for managing power in hybrid power systems. For example, an exemplary embodiment includes a system which comprises a positive voltage supply node and a negative voltage supply node configured for connection to a load, a power source coupled between the positive voltage supply node and the negative voltage supply node, an energy storage device, a solid-state switch, and a control system. The energy storage device and the solid-state switch are connected in series between the positive voltage supply node and the negative voltage supply node. The control system is configured to control activation and deactivation of the solid-state switch to (i) allow the energy storage device to be discharged and supply power to a load, and to (ii) modulate an amount of charging current that flows through the energy storage device from the power source to recharge the energy storage device.

Other embodiments will be described in the following detailed description of exemplary embodiments, which is to be read in conjunction with the accompanying figures.

BRIEF DESCRIPTION OF THE DRAWINGS

FIG. 5 illustrates current waveforms of a power source and an energy storage device as a function of load current, which are generated during an exemplary operating mode of a hybrid power system, according to exemplary embodiments of the disclosure.

FIG. 6 illustrates current waveforms of a load, an energy storage device, and a power source, which are generated during different operating modes of a hybrid power system, according to exemplary embodiments of the disclosure.

DETAILED DESCRIPTION

Figure 1:
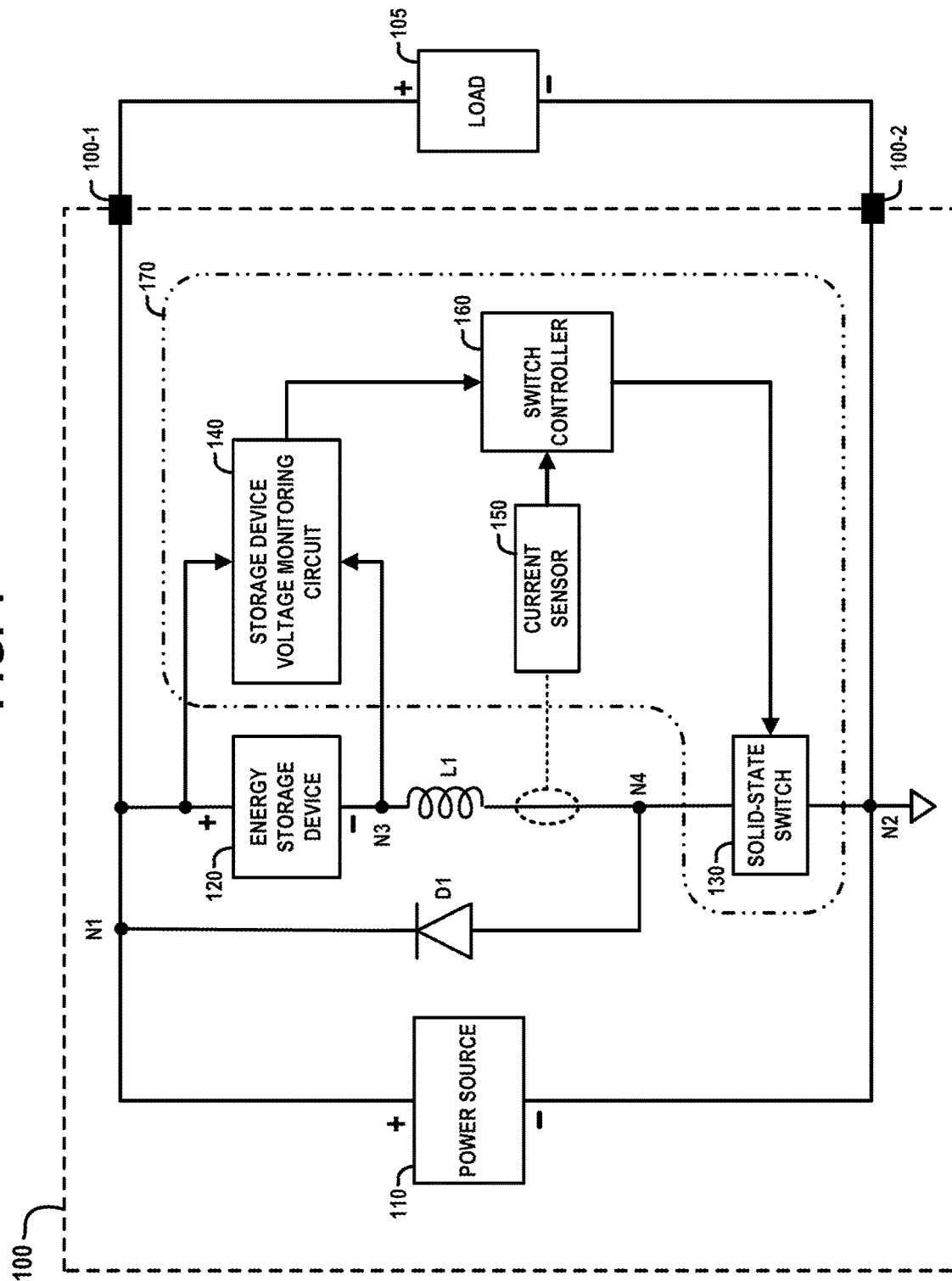
FIG. 1 schematically illustrates a hybrid power system according to an exemplary embodiment of the disclosure.

Embodiments of the disclosure will now be described in further detail with regard to hybrid power systems, and techniques for managing power in hybrid power systems. As explained in further detail below, exemplary embodiments of the disclosure include hybrid power systems which utilize both a power source (e.g., fuel cell) and energy storage device (e.g., battery) to source power to a load under different load conditions. The exemplary hybrid power systems as disclosed herein do not implement high-power DC-DC converters as in conventional systems. Instead, a hybrid power system implements a power management system which is configured to (i) automatically control the amount of power delivered to a load by the energy storage device in conjunction with the power source under high load conditions, and (ii) automatically control and limit an amount of charging current that is supplied from the power source (during low load conditions) to recharge the energy storage device to full voltage. The exemplary hybrid power systems disclosed herein are optimal for power mobility applications, such as a multirotor drone, wherein the power management systems as disclosed herein eliminate the need for high-power DC-DC converters (thus reducing the power system weight) while still protecting the system components (e.g., fuel cell, battery, etc.) from damage due to overvoltage or overcharging, and from entering into unstable operating regimes.

It is to be understood that the various features shown in the accompanying drawings are schematic illustrations that are not drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the term "exemplary" as used herein means "serving as an example, instance, or illustration." Any embodiment or design described herein as "exemplary" is not to be construed as preferred or advantageous over other embodiments or designs.

Further, it is to be understood that the phrase "configured to" as used in conjunction with a circuit, structure, element, component, or the like, performing one or more functions or otherwise providing some functionality, is intended to encompass embodiments wherein the circuit, structure, element, component, or the like, is implemented in hardware, software, and/or combinations thereof, and in implementations that comprise hardware, wherein the hardware may comprise discrete circuit elements (e.g., transistors, inverters, etc.), programmable elements (e.g., ASICs, FPGAs, etc.), processing devices (e.g., CPUs, GPUs, etc.), one or more integrated circuits, and/or combinations thereof. Thus, by way of example only, when a circuit, structure, element, component, etc., is defined to be configured to provide a specific functionality, it is intended to cover, but not be limited to, embodiments where the circuit, structure, element, component, etc., is comprised of elements, processing devices, and/or integrated circuits that enable it to perform the specific functionality when in an operational state (e.g., connected or otherwise deployed in a system, powered on, receiving an input, and/or producing an output), as well as cover embodiments when the circuit, structure, element, component, etc., is in a non-operational state (e.g., not connected nor otherwise deployed in a system, not powered on, not receiving an input, and/or not producing an output) or in a partial operational state.

FIG. 1 schematically illustrates a hybrid power system according to an exemplary embodiment of the disclosure. More specifically, FIG. 1 schematically illustrates a hybrid power system 100 which supplies DC power to a load 105. The hybrid power system 100 comprises a first output terminal 100-1 and a second output terminal 100-2, which are configured to connect to a positive DC input and a negative DC input (e.g., ground), respectively, of the load 105. The hybrid power system 100 further comprises a power source 110, an energy storage device 120, a solid-state switch 130, a storage device voltage monitoring circuit 140 (alternatively, voltage monitoring circuit 140), a current sensor 150, a switch controller 160, a diode D1, and an inductor L1. The solid-state switch 130, the storage device voltage monitoring circuit 140, the current sensor 150, and the switch controller 160, collectively implement a power management system 170 (alternatively, control system), the functions of which will be explained in further detail below.

The power source 110 can be any type of power source that generates DC power. For example, in some embodiments, the power source 110 comprises a multi-cell (or multi-stack) fuel cell that is configured to convert chemical energy of a given type of fuel (e.g., hydrogen, methanol, propane, etc.) and an oxidizing agent (e.g., oxygen) into DC electricity. In some embodiments, the power source 110 comprises a solar panel array photovoltaic cells (or solar cells) that convert light (e.g., sunlight) into DC electricity. The energy storage device 120 can be any type of device that is configured to store energy. For example, in some embodiments, the energy storage device 120 can be a battery. In some embodiments, the energy storage device 120 can be a supercapacitor which is configured to have a sufficient high-energy storage and power density capacity for driving the load 105 for a given application. The load 105 represents a type of electric device such as an electric motor including, but not limited to, an electric vehicle motor (e.g., electric car), a multirotor drone where each rotor or propeller is powered individually by a given motor, etc.

As shown in FIG. 1, the power source 110 has a positive terminal coupled to a first node N1 (e.g., alternatively, positive power supply node), and a negative terminal coupled to a second node N2 (alternatively, negative power supply node, or ground node). Similarly, the load 105 has a positive terminal coupled to the first node N1, and a negative terminal coupled to the second node N2. The energy storage device 120, the inductor L1, and the solid-state switch 130 are connected in series between the first node N1 and the second node N2. In particular, the energy storage device 120 comprises a positive terminal coupled to the first node N1, and a negative terminal coupled to a third node N3. The inductor L1 comprises a first terminal coupled to the third node N3, and a second terminal coupled to a fourth node N4. The diode D1 comprises a cathode terminal coupled to the first node N1, and an anode terminal coupled to the fourth node N4. In this configuration, the diode D1 is connected in parallel with the serially connected energy storage device 120 and inductor L1. In some embodiments, the diode D1 comprises a discrete diode. In other embodiment, the diode D1 can be implemented using a diode-equivalent circuit. The solid-state switch 130 has a first source/drain terminal coupled to the fourth node N4, and a second source/drain terminal coupled to the second node N2.

The voltage monitoring circuit 140 comprises a first input coupled to the first node N1 (e.g., the positive terminal of the energy storage device 120), a second input coupled to the third node N3 (e.g., the negative terminal of the energy storage device 120), and an output coupled to an input of the switch controller 150. The current sensor 150 comprises an input that is coupled to a current path between the third node N3 and the fourth node N4, and an output that is coupled to an input of the switch controller 160. The switch controller 160 comprises an output that is coupled to control terminal (e.g., gate terminal) of the solid-state switch 130.

In general, the power management system 170 is configured to control delivery of power that is sourced to the load 105 from either (i) the power source 110, or (ii) the energy storage device 120, or (iii) a combination of the power source 110 and the energy storage device 120, depending on the power demand of the load 105. More specifically, if the load 105 requires high power, the power management system 170 will begin to source power to the load 105 from the energy storage device 120 at a point at which a DC voltage of the power source 110 decreases below a DC voltage level of the energy storage device 120. When the power demand of the load 105 subsequently decreases, if the energy storage device 120 is depleted of power, the power management system 170 utilize the power source 110 to source power to the load 105 and to recharge the energy storage device 120 using a constant current/constant voltage charging scheme, as discussed below. On the other hand, when the power demand of the load 105 decreases, if the energy storage device 120 is adequately charged to full or near full power, the power management system 170 will utilize the power source 110 to source power to the load 105, and maintain the energy storage device 120 in an idle state.

In some embodiments, the solid-state switch 130 comprises a high-power MOSFET (metal-oxide-semiconductor field-effect transistor) device. The switch controller 160 generates a control signal to activate (turn ON) and deactivate (turn OFF) the solid-state switch 130. As explained in further detail below, in some embodiments, the switch controller 160 is configured to generate a pulse-width modulated (PWM) control signal to control the activation/deactivation of the solid-state switch 130. The solid-state switch 130 is controlled in a manner to protect the energy storage device 120 (e.g., battery) from excess charging current and excess charging voltage. The inductor L1 is configured to limit current transients in the solid-state switch 130 and protect the energy storage device 120 from current spikes during switching of the solid-state switch 130. In some non-limiting embodiments, the inductor L1 has an inductance on the order of tens of micro-Henries (e.g., 33 µH). Further, the inductor L1 is selected to have a "saturation current" which is high enough to accommodate the maximum charging current of the energy storage device 120 (e.g., battery), where the inductor saturation current is defined as the applied DC current at which the inductance value drops a specified amount below its measured value with no DC current. Further, the thermal current rating of the inductor L1 should be high enough to withstand a much higher current when the energy storage device 120 discharges.

When the solid-state switch 130 is switched to an ON state, a current will flow in the current path between the first node N1 to the second node N2 through the energy storage device 120, the inductor L1, and a channel of the solid-state switch 130. More specifically, when the energy storage device 120 is being charged, a charging current will flow from the first node N1 to the second node N2 (in which case charging current flows through the energy storage device 120 from the positive terminal to the negative terminal). When the energy storage device 120 is being utilized to source power to the load 105, current will flow from the second node N2 to the first node N1 through the energy storage device 120 (in which case discharging current flows through the energy storage device from the negative terminal to the positive terminal).

The inductor L1 in the current path between node N1 and node N2 is configured to decrease the rate of change of current flow the current path between nodes N1 and N2 via a self-induced electromotive force (EMF) that is generated by the inductor L1, and which opposes current change. In this regard, the inductor L1 is configured to prevent spiking of the magnitude of the current in the path between nodes N1 and N2 when the solid-state switch 130 is switched ON. In other words, when the solid-state switch 130 is initially switched ON, the current flow will begin to flow in the path between N1 and N2 but does not rise rapidly to a maximum value. Instead, the self-induced EMF within the inductor L1 opposes the increase in current flow and causes the current to slowly increase based on an LR series time constant $$\tau = \frac{L}{R},$$

where L denotes the inductance value of the inductor L1, and R denotes the series resistance ($R_{Series}$) in the complete loop from the positive terminal of the power source 110, through node N1 to the energy storage device 120, through L1, through the solid-state switch 130, and back to the negative terminal of the power source 110, including any effective series resistance of the power source 110 itself. The current approximately reaches its maximum steady state value after a duration of 5τ.

During a period of time when the energy storage device 120 is being charged, when the solid-state switch 130 is switched to an OFF state, the current path from node N4 to node N2 will be cut-off. In this initial state, the charging current through the inductor L1 cannot abruptly change. So when the inductor L1 is effectively disconnected from the second node N2 by deactivation of the solid-state switch 130, stored energy of the inductor L1 causes a change in polarity of the inductor voltage which causes the diode D1 to turn ON, and thereby provide a path for current to flow from the fourth node N4 to the first node N1 to continue charging the energy storage device 120 until either (i) the energy of the inductor L1 is dissipated or (ii) the solid-state switch 130 is switched to an ON state. In this regard, the diode D1 provides a path for charging current when the solid-state switch 130 is switched OFF.

The voltage monitoring circuit 140 is configured to detect a voltage level across the energy storage device 120, and compare the detected voltage level with a predefined voltage threshold to determine if the detected voltage level (i) is less than the predefined threshold voltage or (ii) exceeds the predefined threshold voltage. The voltage monitoring circuit 140 will output a first control signal to the switch controller 160 which indicates the comparison results. The current sensor 150 is configured to detect a magnitude and polarity (current flow direction) of current flowing in the path between nodes N1 and N4. In some embodiments, the current sensor 150 comprises a Hall-Effect current sensor which is configured to sense a magnetic field generated by an AC and/or DC current and convert the sensed magnetic field to a proportional voltage. The current sensor 150 generates and outputs a second control signal to the switch controller 160 where the second control signal is indicative of the magnitude and polarity of the current flow, wherein the polarity of the current indicates whether charging current or discharging current is flowing through the energy storage device 120.

The switch controller 160 is configured to generate a pulse-width modulated (PWM) switch control signal to control the activation/deactivation of the solid-state switch 130 based on the first and second control signals. In some embodiments, the PWM switch control signal comprises a square wave signal having a given frequency, but with a variable duty cycle which depends on a current state of the power source 110 and the energy storage device 120, and the load demand at any given time. For example, as explained in further detail below, during periods of time when the energy storage device 120 is being charged, the duty cycle of the PWM switch control signal will have a high duty cycle during a "constant current charging period", and then have a gradually decreasing duty cycle during a "constant voltage charging period". When the energy storage device 120 is fully charged, the switch controller 160 will generate a PWM switch control signal with a 0% duty cycle so that the solid-state switch 130 is maintained in an OFF state and the energy storage device 120 is not charging (idle state). When a given increase in the load demand results in discharging the energy storage device 120, the switch controller 160 will generate a PWM switch control signal with a 100% duty cycle so that the solid-state switch 130 is maintained in an ON state to thereby allow discharging current to flow through the energy storage device 120 and the channel of the solid-state switch 130 in the path from node N2 to node N1, rather than through an integral body diode of the solid-state switch 130, a feature typically present in MOSFETs.

It is to be understood that the hybrid power system 100 of FIG. 1 can be implemented for various applications. For example, in some exemplary embodiments, the hybrid power system 100 comprises a power pack that is configured for use with mobility applications, such as a multirotor drone, where the power source 110 comprises, e.g., a hydrogen fuel cell, and the energy storage device 120 comprises, e.g., a battery. The exemplary architecture of the hybrid power system 100 eliminates the need for using one or more high-power DC-DC converters that would protect the power source 110 and load 105 by controlling the flow of power into or out of the power source and the load, as in conventional power management systems. As noted above, high-power DC-DC converters are not particularly useful in power packs for, e.g., mobility applications such as multirotor drones, as such high-power DC-DC converters contribute substantial weight to the power pack, and require thermal management techniques to cool the high-power DC-DC converters, which further adds to the overall weight and power cost of the power pack for heat sinks, cooling fans, and other associated components. The load in multirotor drone and other mobility applications already contains one or more electric motor drivers which can be designed or configured to accommodate a range of available supply voltages, obviating the DC-DC converter completely.

The exemplary hybrid power system 100 of FIG. 1 eliminates the use of high-power DC-DC converters. Instead, the hybrid power system 100 implements a combination of the power source 110 and the energy storage device 120 to provide power for the load 105, while utilizing the power management system 170 to control the flow of power for charging the energy storage device 120 (e.g., battery) to prevent excessive charging current and excessive charging voltage, which could damage the energy storage device 120. In addition, in instances where the load 105 generates power (e.g., via regenerative braking), the power management system 170 is configured to utilize such load-generated power to charge the energy storage device 120, and prevent such load-generated power from being applied to the power source 110 (e.g., fuel cell) or control circuitry within the load 105 itself, which could damage the power source 110 or the load 105. However, in some embodiments, low-power circuit components of the hybrid power system 100 and the load device (e.g., flying vehicle), such as a microcontrollers and sensors of the load device, are supplied with stable DC power using small lower-power DC-DC converters that are capable of using the widely varying load voltage at the voltage power supply node N1 for their input.

In the context of an exemplary embodiment of the hybrid power system 100 which implements a fuel cell (as the power source 110) and a battery (as the energy storage device 120) to drive a plurality of electric motors (the load 105) of a multirotor drone device, the number of cells in the fuel cell (stacked fuel cell architecture) can be chosen such that the voltage output of the fuel cell, operating at its maximum rated current, is still high enough to deliver sufficient power to operate the electric motors (load 105). Further, the number of cells in the battery is chosen such that the battery voltage at its minimum state of charge is still high enough to deliver sufficient power to the load 105. For example, in an exemplary embodiment where the electric motors (e.g., load 105) of the multirotor drone can output enough power to keep the vehicle flying when the motor controllers are supplied with as low as 40 volts, the fuel cell system (e.g., power source 110) can be designed to operate in a range of 60V to 40V, and the battery (e.g., energy storage device 120) can be designed to operate from 50V to 40 Volts. When the output voltage of the fuel system falls below the charged voltage of the battery, the transition from fuel cell power to battery power will occur passively (via operation of the power management system 170) depending on the load requirement (as discussed below in conjunction with FIG. 4), rather than actively through DC-DC control instructions.

Figure 2:
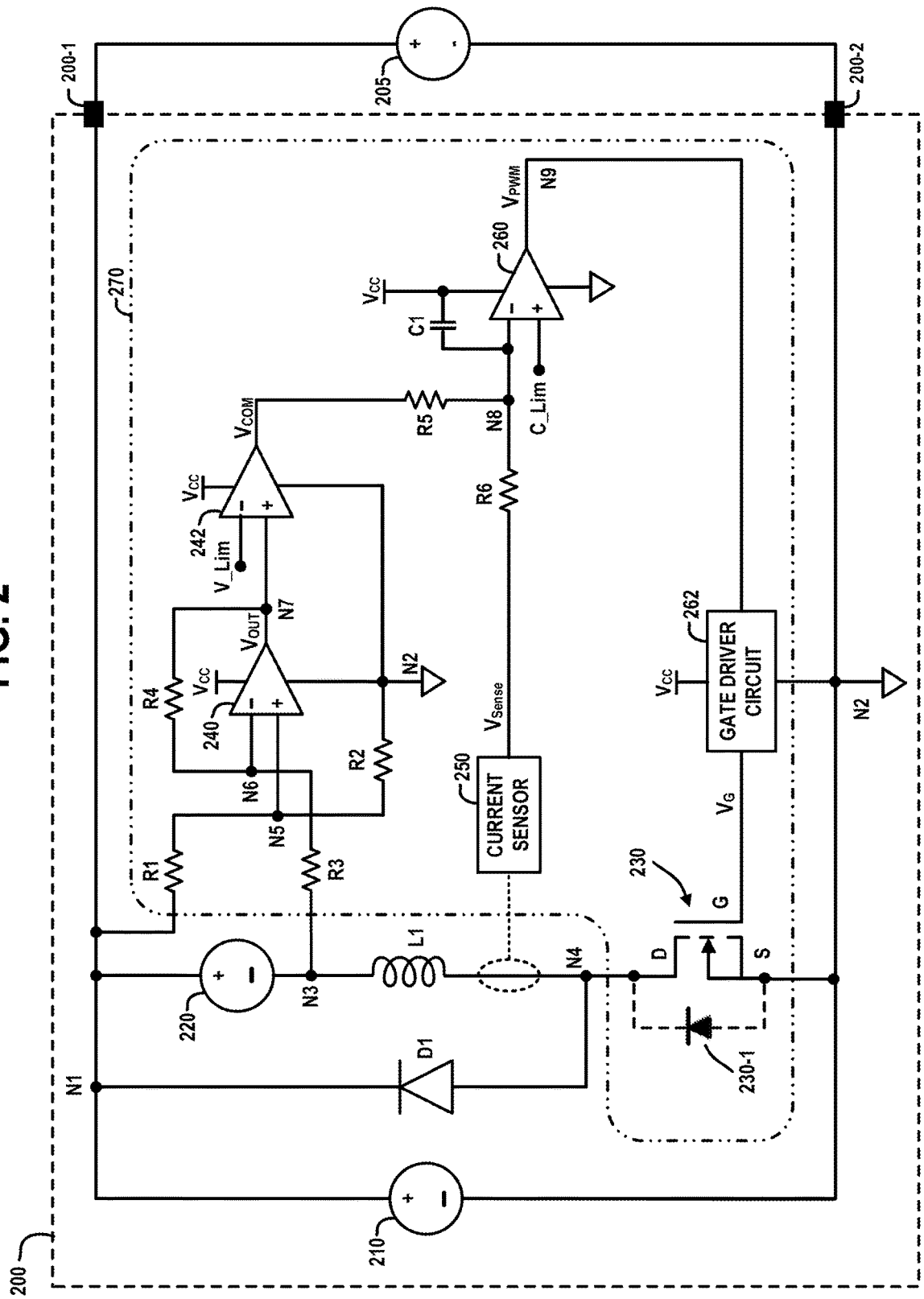
FIG. 2 schematically illustrates a hybrid power system according to another exemplary embodiment of the disclosure.

It is to be understood that the various components of the power management system 170 of FIG. 1 can be implemented using various techniques to provide the exemplary power management functions as discussed herein. For instance, FIG. 2 schematically illustrates a hybrid power system, according to another exemplary embodiment of the disclosure. In particular, FIG. 2 schematically illustrates a hybrid power system 200 which comprises a fuel cell 210, a battery 220 a diode D1, and an inductor L1, and a power management system 270. The fuel cell 210 and battery 220 are utilized to supply DC power to a load 205 (e.g., electric motors of a multirotor drone device) under control of the power management system 270. In general, the power management system 270 is configured to implement functions that are the same or similar to those functions discussed above (for the power management system 170, FIG. 1) to control delivery of power that is sourced to the load 205 from either (i) the fuel cell 210, or (ii) the battery 220, or (iii) a combination of the fuel cell 210 and the battery 220, depending on the power demand of the load 205. The power management system 270 shown in FIG. 2 comprises exemplary circuit configurations and devices for implementing the solid-state switch 130, the storage device voltage monitoring circuit 140, and the switch controller 160 of the exemplary power management system 170 of FIG. 1, the details of which will be discussed in further detail below.

As shown in FIG. 2, the hybrid power system 200 comprises a first output terminal 200-1 and a second output terminal 200-2, which are configured to connect to a positive DC input and a negative DC input (e.g., ground) of the 205. The fuel cell 210 has a positive terminal coupled to a first node N1 (e.g., alternatively, positive power rail), and a negative terminal coupled to a second node N2 (alternatively, negative power rail, or signal ground node). Similarly, the load 205 has a positive terminal coupled to the first node N1 through the first output terminal 200-1, and a negative terminal coupled to the second node N2 through the second output terminal 200-2. The battery 220 comprises a positive terminal coupled to the first node N1, and a negative terminal coupled to a third node N3. The inductor L1 comprises a first terminal coupled to the third node N3, and a second terminal coupled to a fourth node N4. The diode D1 comprises a cathode terminal coupled to the first node N1, and an anode terminal coupled to the fourth node N4. In this configuration, the diode D1 is connected in parallel with the serially connected battery 210 and inductor L1.

The power management system 270 comprises a power MOSFET switch 230, a first operational amplifier 240, a second operational amplifier 242, a current sensor 250, a comparator 260, a gate driver circuit 262, resistors R1, R2, R3, R4, R5, and R6, a capacitor C1. The operational amplifiers 240 and 242, and the comparator 260 each have a positive supply pin connected to a positive voltage supply bus (+$V_{CC}$), and a negative supply pin connected to the second node N2 (e.g., ground or 0V). In some embodiments, the power MOSFET switch 230 comprises an exemplary implementation of the solid-state switch 130 of FIG. 1. In some embodiments, the first and second operational amplifiers 240 and 242 and resistors R1, R2, R3, and R4 comprise an exemplary implementation of the storage device voltage monitoring circuit 140 of FIG. 1. Further, in some embodiments, the comparator 260, the gate driver circuit 262, the resistors R5 and R6, and the capacitor C1 comprise an exemplary implementation of the switch controller 160 of FIG. 1.

In some embodiments, the power MOSFET switch 230 comprises an N-type enhancement MOSFET device having gate (G) terminal, drain (D) terminal, and source (S) terminal, as shown. The drain (D) terminal is coupled to the fourth node N4, and the source terminal is coupled to the second node N2. The power MOSFET switch 230 also comprises an intrinsic body diode 230-1 which represents a P-N junction between a P-type substrate body and N-doped drain regions of the MOSFET switch 230. It is to be noted that the intrinsic body-to-source diode of the power MOSFET switch 230 is not shown as it is assumed that such intrinsic diode is shorted out by connections between the source region and the substrate body (e.g., N+ source and P body junction are shorted through source metallization). When the gate voltage is high enough to induce a conductive channel, current will flow in the channel of the MOSFET switch 230 from the drain (D) terminal to the source (S) terminal or from the source (S) terminal to the drain (D) terminal. However, even when the gate voltage is too low to induce a conductive channel, current can still flow from the source (S) terminal to the drain (D) terminal via the shorted source-to-body connection and the body-to-drain diode.

The first operational amplifier 240 comprises a non-inverting input terminal coupled to a fifth node N5, an inverting input terminal coupled to a sixth node N6, and an output coupled to a seventh node N7. The first and second resistors R1 and R2 are serially connected between the first node N1 and the second node N2. The third and fourth resistors R3 and R4 are serially connected between the third node N3 and the seventh node N7. The second operational amplifier 242 comprises a non-inverting input terminal coupled to the seventh node N7, an inverting input terminal which receives as input a predefined threshold voltage V_Lim, and an output terminal that is coupled to an eight node N8 through the fifth resistor R5.

In the exemplary configuration shown in FIG. 1, the first operational amplifier 240 and the resistors R1, R2, R3, and R4 comprise a differential amplifier circuit which is configured to generate an output voltage $V_{OUT}$ on node N7 that is proportional to a difference between the voltage on node N1 ($V_{N1}$) and the voltage on node N3 ($V_{N3}$) as follows:

$$V_{OUT} = V_{N1}\left(\frac{R2}{R1+R2}\right)\left(\frac{R3+R4}{R3}\right) - V_{N3}\left(\frac{R4}{R3}\right).$$

Assuming that R1=R3=Ra, and assuming that R2=R4=Rb, the output voltage output voltage $V_{OUT}$ on node N7 is determined as:

$$V_{OUT} = (V_{N1} - V_{N3})\left(\frac{Rb}{Ra}\right).$$

For example, in a non-limiting exemplary embodiment, R1=R3=100 kiloohms (kΩ), and R2=R4=5Ω. Essentially, the differential amplifier circuit is configured to determine a voltage level across the positive and negative terminals of the battery 220, i.e., ($V_{N1}-V_{N3}$), and then scale the voltage level by a fixed value $$\left(\frac{Rb}{Ra}\right).$$

For example, assuming Rb=5 kΩ and Ra=100 kΩ, the scaling value $$\left(\frac{Rb}{Ra}\right) = 0.05.$$

The second operational amplifier 242 is configured to continuously monitor the output voltage $V_{OUT}$ generated by the differential amplifier on the node N7 and compare the output voltage $V_{OUT}$ with the predetermined threshold voltage V_Lim (or charging limit). In some embodiments, the predetermined threshold voltage V_Lim corresponds to a maximum voltage of the battery 220. By way of example, assuming that the battery 220 has a maximum voltage of 50V, and the scaling value of the differential amplifier is $$\left(\frac{Rb}{Ra}\right) = 0.05,$$

the predefined threshold voltage V_Lim (charging limit) can be set to 2.5V. The predetermined threshold voltage V_Lim can be generated using, e.g., a precision voltage reference generator, or resistive voltage divider network, etc. For example, in some embodiments, the predetermined threshold voltage V_Lim can be set using a low power DC-DC converter circuitry that is configured to generate reference voltages and low power supply voltages for the power management system 270 and other low power control circuitry associated with the load 205.

In operation, when the monitored battery voltage $V_{OUT}$ is less than V_Lim, the output voltage $V_{COM}$ of the second operational amplifier 242 will be 0V (e.g., ground voltage on node N2). On the other hand, when the monitored battery voltage $V_{OUT}$ reaches V_Lim, the output voltage $V_{COM}$ of the second operational amplifier 242 will transition to $V_{CC}$ (e.g., 12V). In some embodiments, the second operational amplifier 242 is configured to operate as a comparator with an output slew rate that is configured to provide a slower transition time between states for purposes of preventing oscillation (as compared to a comparator circuit that is typically designed to operate as fast as possible to minimize propagation delay and to provide fast transition time at the output).

The comparator 260 comprises an inverting input terminal coupled to node N8, and a non-inverting input terminal which is coupled to predetermined threshold voltage C_Lim (referred to as current limiting threshold). The comparator 260 comprises an output terminal coupled to a node N9. The resistor R5 has a first terminal coupled to an output terminal of the second operational amplifier 242, and a second terminal coupled to the node N8. The resistor R6 has a first terminal coupled to on output of the current sensor 250, and a second terminal coupled to the node N8. The capacitor C1 has a first terminal coupled to the inverting input terminal of the comparator 260, and a second terminal coupled to the power supply node $V_{CC}$.

Collectively, the comparator 260, the capacitor C1, and the resistors R5 and R6 comprise a current limit oscillator circuit that is configured to generate a PWM square wave voltage signal $V_{PWM}$ on node N9, which is applied to an input of the gate driver circuitry 262. The gate driver circuitry 262 is configured to generate a pulse-width modulated gate control signal $V_G$, which is applied to the gate terminal of the power MOSFET switch 230.

In operation, current sensor 250 senses a current flow in the path between nodes N3 and N4 and generates a sense voltage $V_{Sense}$ (or first control voltage) which corresponds to a magnitude and direction (polarity) of the sensed current, times an exemplary current-to-voltage scale factor of 0.04, plus an exemplary offset such as 2.5 V. The second operational amplifier 242 generates a voltage $V_{COM}$ (or second control voltage) which indicates whether the voltage of the battery 220 is less than or meets a maximum voltage level of the battery 220. The control voltages $V_{COM}$ and $V_{Sense}$ are mixed together at node N8 via respective resistors R5 and R6, and applied to the inverting input terminal of the comparator 260. The resistors R5 and R6 are selected to adjust a weighting factor of the control voltages $V_{COM}$ and $V_{Sense}$ that are combined at node N8. In particular, in some embodiments, the control voltage $V_{COM}$ varies from 0V to 12V, and the control voltage $V_{Sense}$ varies from, e.g., 2.5V to 2.8V. In this instance, the resistance values are selected such that R5 is greater than R6. For example, in a non-liming exemplary embodiment, R5 has a resistance of about 25 k and R6 has a resistance value of about 1.0 kW. This exemplary resistance ratio allows the voltage level on node N8 to be sensitive to changes in the control voltage $V_{Sense}$, and not overwhelmed by the higher voltage level of the control voltage $V_{COM}$.

The comparator 260 is configured to continuously compare the voltage at node N8 with the current limiting threshold voltage C_Lim. The output (at node N9) of the comparator 260 (at node N9) is pulled down to 0V (e.g., ground voltage), when the voltage on node N8 is greater than C_Lim, otherwise the output (at node N9) of the comparator 260 is pulled up to $V_{CC}$ when the voltage on node N8 is less than C_Lim. The current limiting threshold voltage C_Lim is selected such that the comparator 260 outputs 0V (turns off) when either (i) the sensed charging current is high or (ii) the voltage level of the battery 220 is high. In other words, when the voltage at node N8 is greater than C_Lim, the output voltage $V_{PWM}$ on node N9 will be at ground voltage. By way of example, in an exemplary non-limiting embodiment, the current limiting threshold voltage C_Lim is set to 2.73V.

The current limit oscillator circuit is configured (via implementation of the capacitor C1, the resistor R6, and the timing delay of the current sensor) to oscillate between ON and OFF states instead of dwelling at intermediate states. Essentially, the capacitance value of the capacitor C1 controls the oscillation frequency at the output of the comparator 260. The capacitor C1 serves to provide some phase delay at the inverting input terminal of the comparator 260 which causes the voltage at node N8 to slowly change in response to changes in the first and second control voltages $V_{COM}$ and $V_{SENSE}$ that are output from the second operational amplifier 242 and the current sensor 250, respectively, and applied to the node N8 via the respective resistors R5 and R6. In effect, the capacitor C1 and the resistor R6 determine an RC time constant for the charging/discharging of node N8 in response to the control voltage $V_{SENSE}$, which, in turn affects the oscillation frequency of the pulse-width modulated voltage signal $V_{PWM}$ at the output (node N9) of the comparator 260 (e.g., the frequency of $V_{PWM}$ can vary during a constant current charging period of operation).

In some embodiments, the oscillation frequency of the pulse-width modulated voltage signal $V_{PWM}$ at the output (node N9) of the comparator 260 is high enough to obtain a stable current through the inductor L1, but low enough that the current sensor 250 can effectively sense the current flow in the path between nodes N3 and N4. In other words, depending on the implementation of the current sensor 250, any timing delay associated the current sensing operation of the current sensor 250 is a factor that is considered when implementing the current limit oscillator circuit. For example, timing delay of the current sensor 250 can be relatively significant when the current sensor 250 comprises an isolated Hall sensor.

Figure 3:
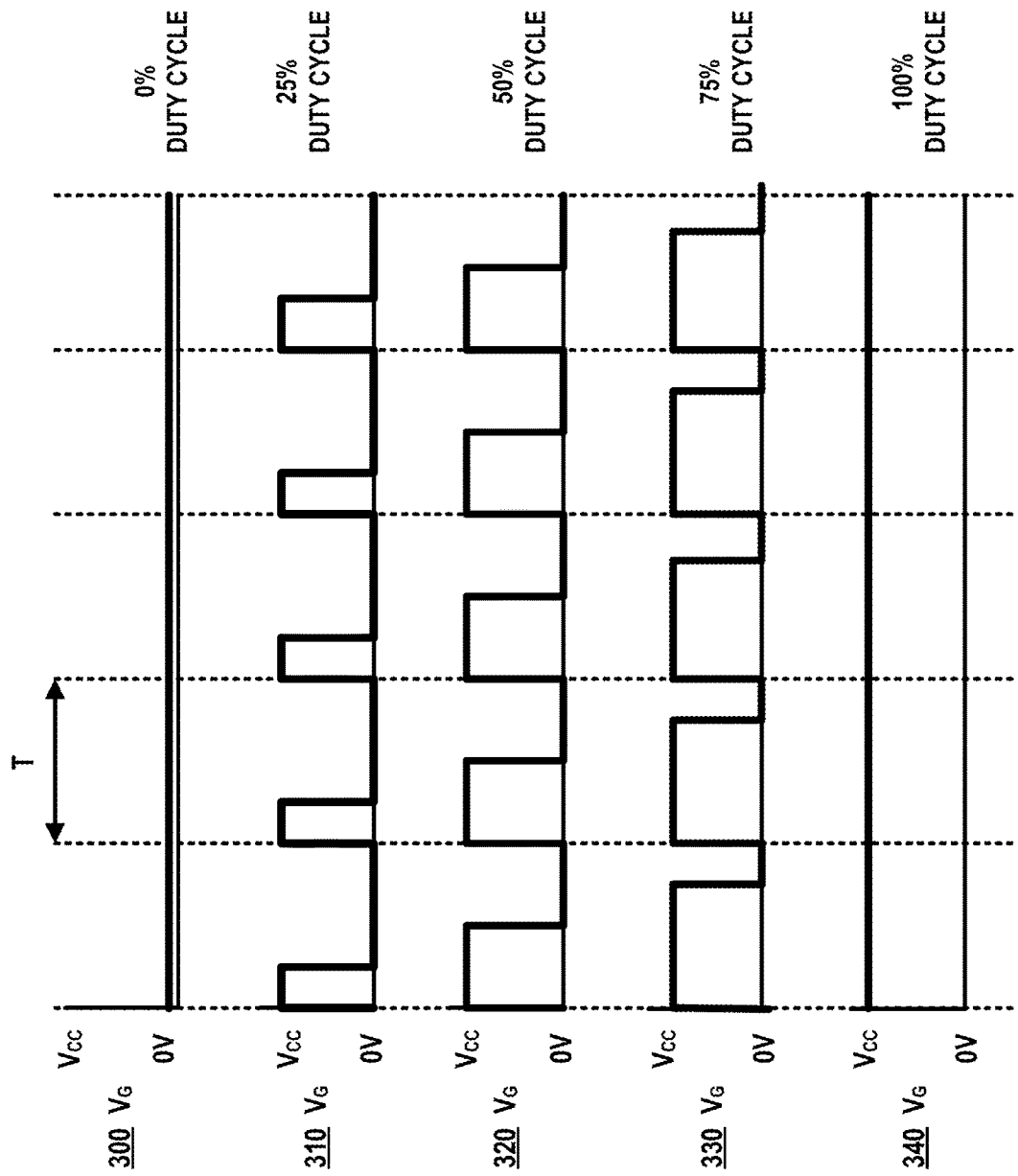
FIG. 3 illustrates a pulse-width modulated gate control signal having different duty-cycles, which is applied to a solid-state switch device to control a charging current and voltage of an energy storage device of a hybrid power system, according to an exemplary embodiment of the disclosure.

The voltage output $V_{PWM}$ on node N9 is applied to the input of the gate driver circuit 262. The gate driver circuit 262 is configured to source and sink a sufficient amount of current to convert the voltage output $V_{PWM}$ on node N9 to a pulse-width modulated gate control signal $V_G$ which is applied to the gate terminal of the power MOSFET switch 230 to quickly switch the state of the power MOSFET switch 230. FIG. 3 illustrates a pulse-width modulated gate control signal $V_G$ having different duty-cycles, which is applied to the solid-state switch device (e.g., power MOSFET switch 230) to control the charging current and voltage of the energy storage device (e.g., battery 220).

More specifically, FIG. 3 illustrates (i) a pulse-width modulated gate control signal $V_G$ 300 having a 0% duty cycle, (ii) a pulse-width modulated gate control signal $V_G$ 310 having a 25% duty cycle, (iii) a pulse-width modulated gate control signal $V_G$ 320 having a 50% a duty cycle, (iv) a pulse-width modulated gate control signal $V_G$ 330 having a 75% duty cycle, and (v) a pulse-width modulated gate control signal $V_G$ 340 having a 100% duty cycle. As shown in the exemplary embodiment of FIG. 3, the pulse-width modulated gate control signals $V_G$ have a voltage level which is maintained at 0V (for 0% duty cycle) over multiple oscillation periods (T), maintained at $V_{CC}$ (for 0% duty cycle) over multiple oscillation periods (T), or which switches between 0V and $V_{CC}$ (for, e.g., 25%, 50%, 5% duty cycles) over multiple oscillation periods (T). The high level signal can be $V_{CC}$ as shown in the example or a different voltage depending on the operating requirements of the power MOSFET switch 230.

As noted above, the pulse-width modulated gate control signal $V_G$ is applied to the gate terminal of the power MOSFET switch 230 to control the activation and deactivation of the power MOSFET switch 230 and, thereby, control and limit the amount of charging current and charging voltage of the battery 220. In effect, the switching of the power MOSFET switch 230 under control of the pulse-width modulated gate control signal $V_G$ results in the modulation of charging current amplitude to the battery 220. If the fuel cell 210, the battery 220, and the load 205 were connected in parallel without the protection of the power management system 270, the battery would be damaged due to excessive charging current and excessive charging voltage. The pulse-width modulated gate control signal $V_G$ will have a variable duty cycle which is automatically adjusted as needed (by changing the duty cycle of the control voltage $V_{PWM}$ output on node N9 via operation of the current limit oscillator circuit) depending on the state of operation of the hybrid power system 200 at a given time.

Figure 4:
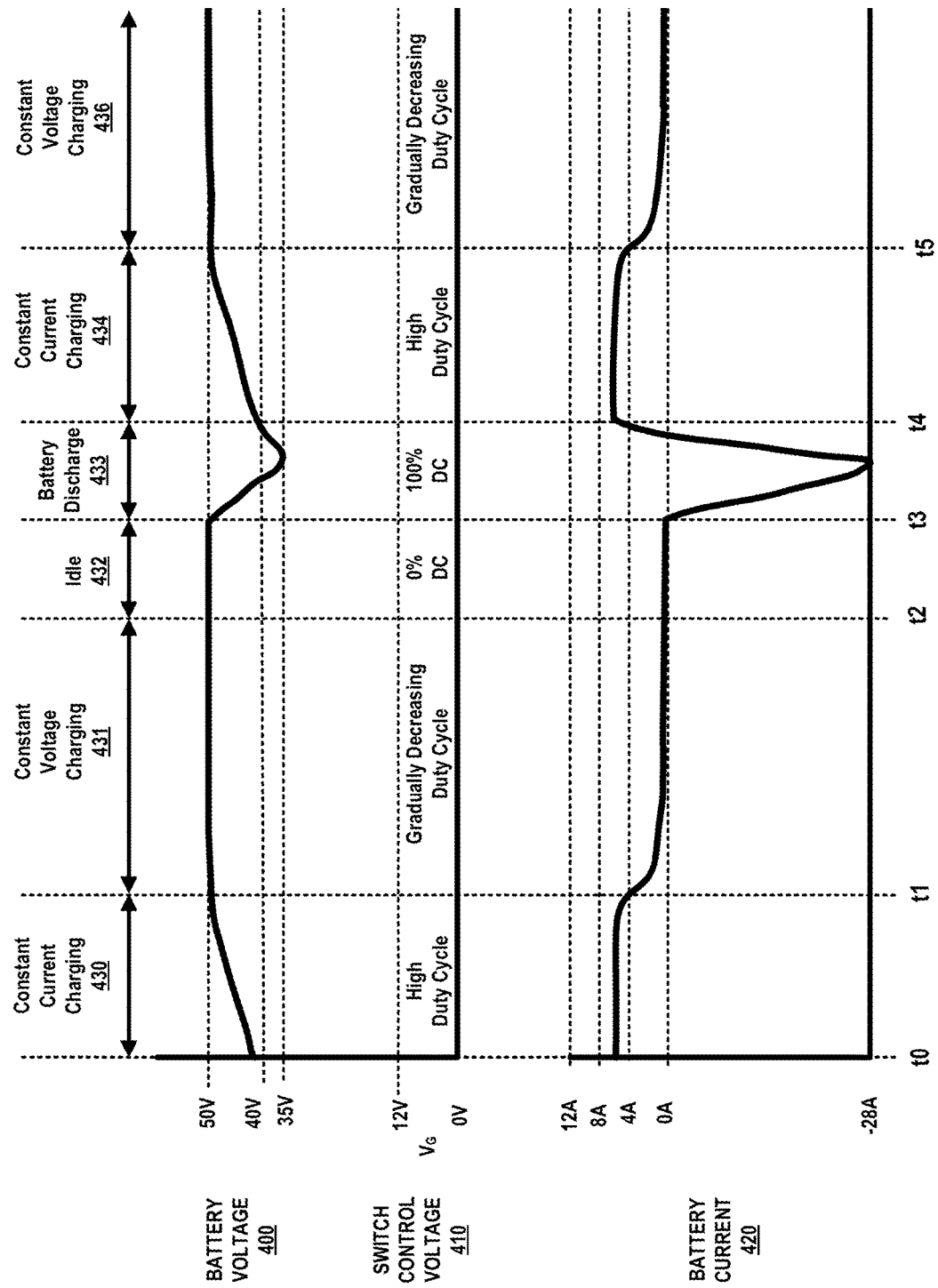
FIG. 4 illustrates voltage and current waveforms of an energy storage device, which are generated during different operating modes of a hybrid power system, according to exemplary embodiments of the disclosure.

FIGS. 4, 5, and 6 are waveform and timing diagrams that collectively illustrate exemplary operating modes of a hybrid power system, according to exemplary embodiments of the disclosure. More specifically, FIG. 4 illustrates voltage and current waveforms of an energy storage device, which are generated during different operating modes of a hybrid power system, according to exemplary embodiments of the disclosure, FIG. 5 illustrates current waveforms of a power source and an energy storage device as a function of load current, which are generated during an exemplary operating mode of a hybrid power system, according to exemplary embodiments of the disclosure, and FIG. 6 illustrates current waveforms of a load, an energy storage device, and a power source, which are generated during different operating modes of a hybrid power system, according to exemplary embodiments of the disclosure. For purposes of illustration, FIGS. 4, 5, and 6 will be discussed in the context of a hybrid power system, such as shown in FIG. 2, which implements a fuel cell 210 and a battery 220 to source power to a load 205, e.g., multirotor drone device. In FIGS. 4-6, it is assumed that the battery 220 has a maximum voltage level of about 50V.

In this exemplary context, FIG. 4 illustrates a battery voltage waveform 400, a varying duty cycle switch control voltage $V_G$ 410, and a battery current waveform 420, at different operating modes of the hybrid power system 200. The operating modes shown in FIG. 4 include a constant current charging mode 430 (which occurs during a period t0-t1), a constant voltage charging mode 431 (which occurs during a period t1-t2), a battery idle mode 432 (which occurs during a period t2-t3), and a battery discharge mode 433 (which occurs during a period t3-t4). In addition, FIG. 4 illustrates an additional constant current charging mode 434 (which occurs during a period t4-t5), and an additional constant voltage charging mode 436 (which begins at t5), which occur following the battery discharge mode 433.

In FIG. 4, it is assumed that prior to t1, the battery 220 was discharged to 40 V or less as a result of a large load demand. When the load demand decreases, the battery 220 is recharged using current from the fuel cell 210. The battery recharging process begins with the constant current charging mode 430 in which a switch control signal $V_G$ 410 having a high duty cycle is applied to the power MOSFET switch 230 during the period t0-t1 to thereby generate a constant charging current to charge the battery 220. As shown in FIG. 4, the battery current waveform 420 shows a constant recharging current of about 6 A (more specifically, constant average current) which flows into the positive terminal of the battery 220 during the constant current charging period t0-t1. In reality, during the constant current charging period t0-t1, the magnitude of the battery charging current fluctuates between, e.g., 8 A and 4 A, as a result of the power MOSFET switch 230 switching ON and OFF by the pulse-width modulated gate control signal $V_G$.

Furthermore, as shown in FIG. 4, the battery voltage waveform 400 shows the battery voltage increasing from about 40V to about 50V during the constant current charging period t0-t1. While FIG. 4 shows the battery voltage increasing with linear slope for ease of illustrates, in reality, during the constant current charging period t0-t1, the magnitude of the battery voltage will fluctuate up and down as a result of the power MOSFET switch 230 switching ON and OFF by the pulse-width modulated gate control signal $V_G$, but the battery voltage 400 will have an increasing trending slope, as shown in FIG. 4.

Following the constant current charging mode 430, the hybrid power system 200 enters into the constant voltage charging mode 431. In this mode, a switch control signal $V_G$ 410 having a gradually decreasing duty cycle is applied to the power MOSFET switch 230 during the period t1-t2 to generate a gradually decreasing charging current to continue charging the battery to a full charge of, e.g., 50V. As shown in FIG. 4, during the constant voltage charging period t1-t2, the battery current 420 continuously decreases toward 0 A, while the battery voltage 400 stays relatively constant, but slightly increases to full voltage charge (e.g., 50V) as a result of the small (and continuously decreasing) battery charging current that is generated during such period t1-t2.

Next, following the constant voltage charging mode 431, when the battery 220 reaches full charge, a switch control signal $V_G$ 410 having a 0% duty cycle is applied to the power MOSFET switch 230 starting at time t2, which causes the power MOSFET switch 230 to turn OFF. As a result, no charging current flows through the battery 220, and the hybrid power system 200 enters the battery idle mode 432. During the battery idle mode 432, the battery 220 is fully charged and ready to contribute power to the load 205 when needed.

For example, FIG. 4 shows that at time t3, the battery 220 begins to contribute power to the load 205 in response to a large load demand which is assumed to cause the voltage of the fuel cell 210 to drop below the full charge voltage level of the battery 220. Referring to FIG. 2, when the battery 220 initially begins to discharge, discharging current (negative current) initially begins to flow through the body diode 230-1 of the power MOSFET switch 230, through the inductor L1, and through the battery 220 from the negative terminal to the positive terminal. The current sensor 250 senses the negative current (indicating that the battery 220 is discharging via the body diode 230-1 of the power MOSFET switch 230), and outputs a control signal $V_{SENSE}$ which causes the current limit oscillator circuit to pull the output node N9 to $V_{CC}$ and cause the gate driver circuit 262 to generate a switch control signal $V_G$ 410 having a 100% duty cycle that is applied to power MOSFET switch 230 during the period t3-t4. In this regard, during the battery discharge mode 433, the power MOSFET switch 230 will remain turned ON to allow discharging current to flow freely through the channel of the power MOSFET switch 230 to minimize power dissipation.

As shown in FIG. 4, during the battery discharge period t3-t4, the battery voltage waveform 400 decreases from 50V to 35V, as a result of an increasing discharge current. In particular, during the battery discharge period t3-t4, the battery current waveform 430 shows an increasing discharge current (negative current) which increases to a peak discharge current of about 28 A, and then slowly decreases to 0 A as the load demand decreases and as the fuel cell 210 begins to handle the load demand and begin recharging the battery 220. As such, following the battery discharge period t3-t4, the hybrid power system 200 enters into the subsequent constant current charging mode 434 (period t4-t5), and constant voltage charging mode 435 (starting at t5) to recharge the battery 220 to full voltage (via power from the fuel cell 210) using the same process as discussed above.

FIG. 5 illustrates current waveforms of a power source and an energy storage device as a function of load current, which are generated during an energy storage device discharge operating mode of a hybrid power system, according to exemplary embodiments of the disclosure. More specifically, FIG. 5 illustrates an exemplary fuel cell current waveform 510 and an exemplary battery current waveform 520, as a function of load current (x-axis), during an exemplary battery discharge operating mode 500. FIG. 5 shows a contribution of fuel cell current and battery current to source the load current demand. When the load current demand is less than about 40 A, the fuel cell 210 is capable of handling the load demand, and the battery 220 is not discharged. However, as the load current increases past 40 A, the battery 200 starts to discharge as indicated by the negative current of the battery current waveform 520. As the load current demand increases, the battery provides a greater contribution to sourcing power (current) to the load. For example, as shown in FIG. 5, at a load current demand of 70 A, the fuel cell 210 supplies a load current of about 50 A, and the battery 220 supplies a load current of about 20 A.

FIG. 6 illustrates current waveforms of a load, an energy storage device, and a power source, which are generated during different operating modes of a hybrid power system, according to exemplary embodiments of the disclosure. More specifically, FIG. 6 illustrates an exemplary load current waveform 610, an exemplary battery current waveform 620, and an exemplary fuel cell current waveform 630, and exemplary operating modes of the hybrid power system 200 of FIG. 2. FIG. 6 shows a period t0-t2 in which a load current is low and constant (e.g., load current waveform 610 constant at around 30 A). During a period t0-t1 (e.g., constant current charging period), it is assumed the fuel cell 210 is sourcing current to the load and charging current to the battery 220. In particular, during the period t0-t1, FIG. 6 shows the fuel cell current waveform 630 supplying a total current of about 40 A including about 30 A of load current and about 10 A of battery charging current. During the period t1-t2 (e.g., constant voltage charging, and battery idle period), FIG. 6 shows the fuel cell current waveform 630 supplying a total current of about 30 A to source the 30 A of load current, and the battery current waveform 620 at 0A since, as explained above, very little and no battery charging current flows to the battery 220 during the constant voltage charging and battery idle period.

At time t2, the load demand increases through time t5, which results in a spike of the load current waveform 610 from 30 A to about 100 A. Initially, the fuel cell current waveform 630 shows the fuel cell 220 sourcing the increased load current during the period from t2-t3, until the load current waveform 610 reaches about 50 A at time t3, at which time the battery 220 starts to discharge to contribute current to source the load demand. As shown in FIG. 6, at the peak of the load current waveform 610, the load current of about 100 A is sourced with about 38 A of the battery current, and about 62 A of the fuel cell current.

At time t4, the load current decreases to a level (e.g., about 50 A) which is sourced solely by the fuel cell current, while the hybrid power system enters into a constant current charging period in which the battery 220 begins to be charged with a constant current (e.g., around 10 A) supplied by the fuel cell 210, as shown by the battery current waveform 620 and the fuel cell waveform 630 during the period t4 to t8.

FIG. 6 further illustrates a regenerative breaking event which occurs during the period t6-t7. As is known in the art, regenerative braking converts kinetic energy into electricity which can charge a battery. In the context of a multirotor drone device, when a pilot of the drone issues a command for the drone to descend or reduce speed, the motor controllers can, depending on their design, be configured for regenerative braking. In accordance with exemplary embodiments of the disclosure, when the hybrid power system 200 is implemented for a drone application, the battery 220 and the battery charging current can be chosen such that the regenerative braking power is less than the battery charging power.

As shown in FIG. 6, a regenerative breaking event at time t6 causes the load current to become negative (i.e., load supplies current) as indicated by the negative current spike of the load current waveform 610 in the period t6-t7, reaching about −6 A. In response, the output current of the fuel cell 210 decreases to 0 A, as indicated by the positive current spike of the fuel cell current waveform 630 in the period t6-t7. During the regenerative breaking event, the battery 220 absorbs current as part of its charging routine. In this regard, during regenerative braking events, the battery charging protects the electronics of the load device (e.g., drone) which would be damaged from a voltage spike if the braking energy were not absorbed in the battery 220.

Figure 7A:
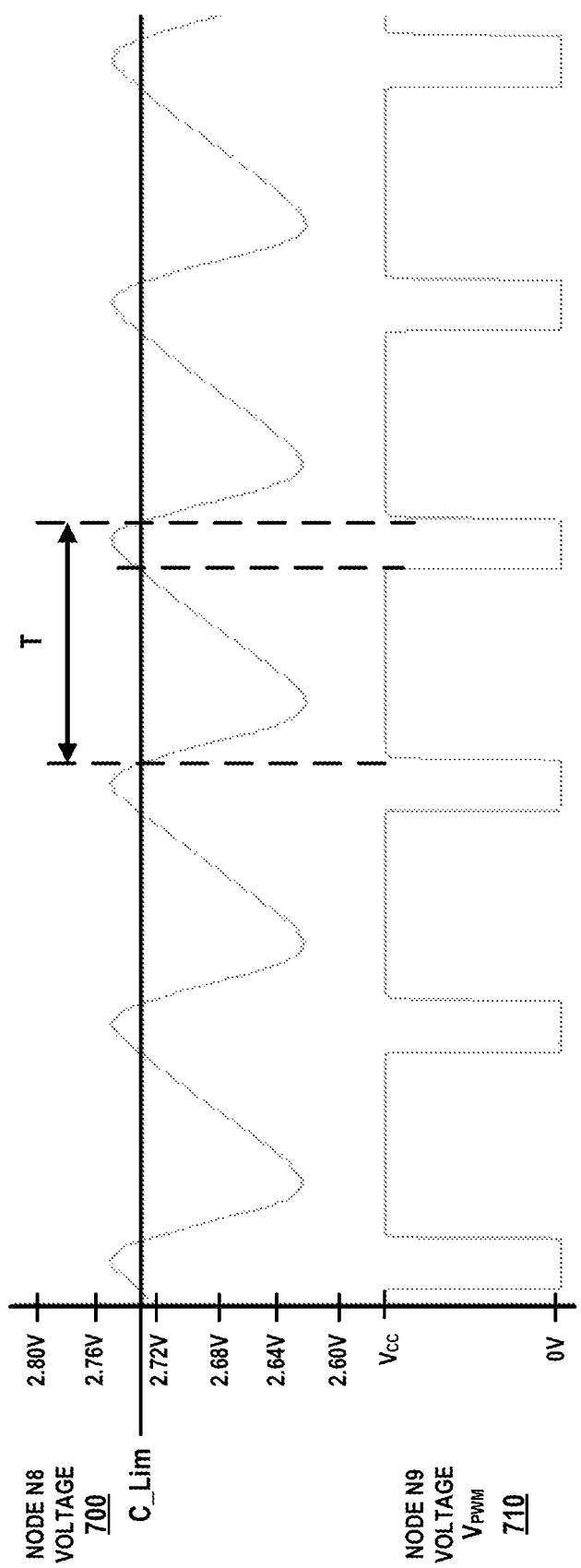
FIGS. 7A and 7B are waveform diagrams that illustrate an exemplary mode of operation of a current limit oscillator circuit of a hybrid power system, according to an exemplary embodiment of the disclosure.
Figure 7B:
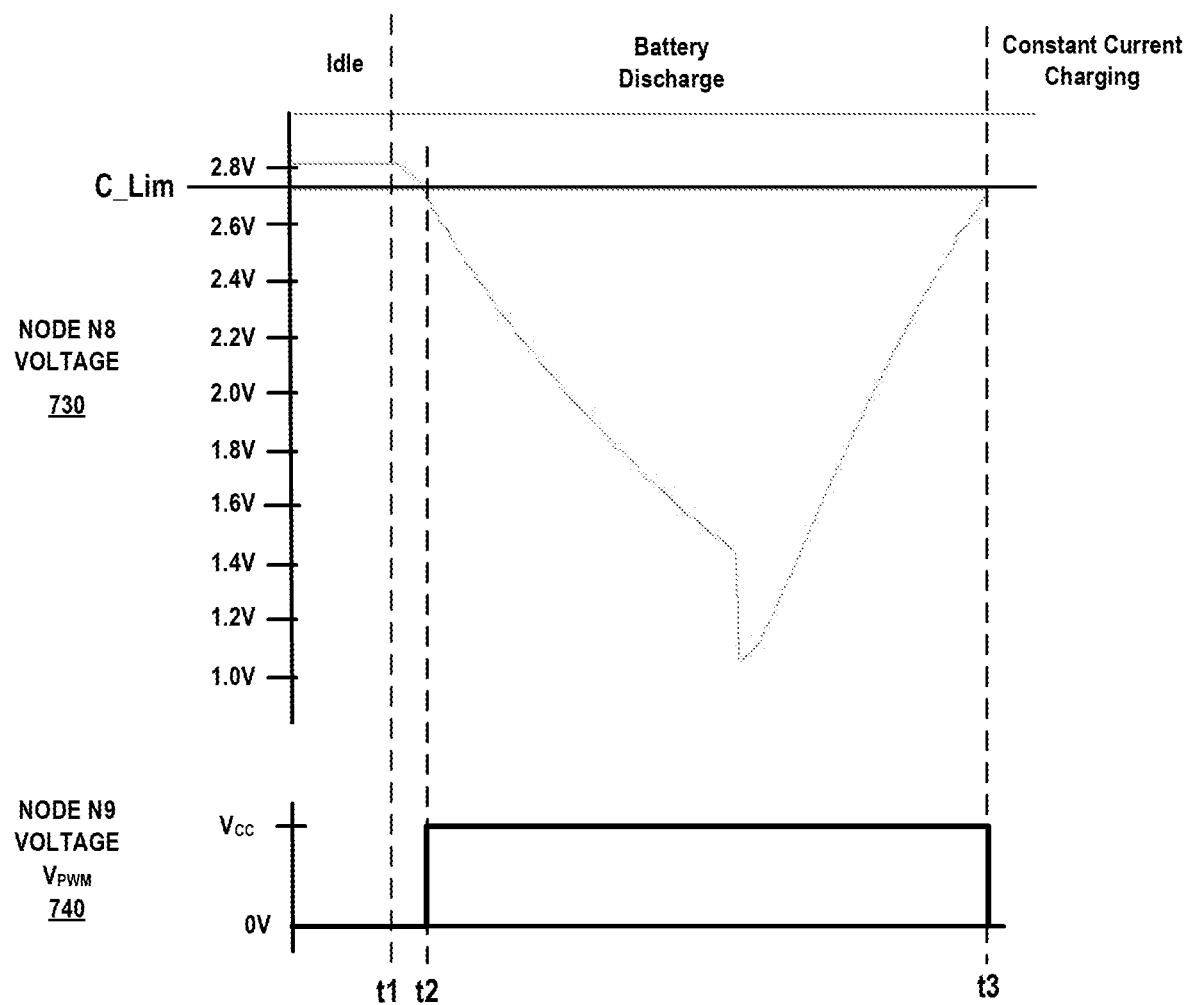

FIGS. 7A and 7B are waveform diagrams that illustrate an exemplary mode of operation of a current limit oscillator circuit of a hybrid power system, according to an exemplary embodiment of the disclosure. More specifically, FIG. 7A illustrates an exemplary voltage waveform 700 of a voltage that is generated at node N8 at the inverting input terminal of the comparator 260 (FIG. 6) during a portion of a constant current charging period of operation. FIG. 7A further illustrates an exemplary voltage waveform 710 of the voltage at node N9 ($V_{PWM}$), which is generated at the output of the comparator 260 during the portion of the constant current charging period of operation. In addition, FIG. 7A illustrates an exemplary current limit threshold voltage C_Lim of 2.73V.

As shown in FIG. 7A, the exemplary voltage waveform 700 on node N8 fluctuates between peak voltages above and below the current limit threshold voltage C_Lim. For example, in FIG. 7A, the voltage on node N8 fluctuates between 2.62V and 2.75 V during the illustrated portion of the constant current charging period of operation. During periods of time when the voltage waveform 700 is below the current limit threshold voltage C_Lim, the voltage waveform $V_{PWM}$ 710 at the output of the comparator 260 transitions to $V_{CC}$. During periods of time when the voltage waveform 700 is above current limit threshold voltage C_Lim, the voltage waveform $V_{PWM}$ 710 at the output of the comparator 250 transitions to 0V. It is to be understood that the peak voltages of the voltage on node N8 will slightly vary during the constant current charging period to vary the duty cycle. For example, to obtain a higher duty cycle, the fluctuating voltage on the node N8 will increase.

Next, FIG. 7B illustrates an exemplary voltage waveform 730 of a voltage that is generated at node N8 at the inverting input terminal of the comparator 260 (FIG. 6) during a portion a battery idle period (up to time t1) and during a battery discharge period (from t1-t3). FIG. 7B further illustrates an exemplary voltage waveform 740 of the voltage at node N9 ($V_{PWM}$), which is generated at the output of the comparator 260 during the same battery idle and battery discharge periods. In addition, FIG. 7B illustrates the exemplary current limit threshold voltage C_Lim of 2.73V.

As shown in FIG. 7B, during the battery idle period (prior to t1), the exemplary voltage waveform 730 on node N8 remains relatively constant above current limit threshold voltage C_Lim. As such, the voltage waveform $V_{PWM}$ 740 at the output of the comparator 260 is maintained at 0V. During the period t1-t2, it is assumed that the battery 230 begins to discharge with the discharge current initially flowing through the intrinsic body diode 230-1 of the power MOSFET switch 230. As a result of the discharging current sensed by the current sensor 250, the voltage waveform 730 on node N8 starts to decrease. At time t2, the voltage waveform 730 on node N8 falls below the current limit threshold voltage C_Lim, which causes the voltage waveform $V_{PWM}$ 740 at the output of the comparator 260 to transition to $V_{CC}$, which, in turn, causes the power MOSFET switch 230 to turn ON so that the discharging current flows through the channel of the power MOSFET switch 230.

As further shown in FIG. 7B, during the period t2-t3 of the battery discharge period, the exemplary voltage waveform 730 on node N8 remains below the current limit threshold voltage C_Lim, such that the voltage waveform $V_{PWM}$ 740 at the output of the comparator 260 is generated with a 100% duty cycle. At the end of the battery discharge period, at time t3, the exemplary voltage waveform 730 on node N8 increases above the current limit threshold voltage C_Lim, and the continues to fluctuate above and below the current limit threshold voltage C_Lim, during the constant current charging period subsequent to time t3, similar to what is shown in FIG. 7A.

In some embodiments, during the constant current charging period the duty cycle of the voltage waveform $V_{PWM}$ at the output of the comparator 260 will be high, and will increase as a result of the increasing battery voltage. In this regard, the effect of the pulse-width modulated switching of the power MOSFET switch 230 is to perform a DC-to-DC transformation. During the constant current charging period, the voltages of the power supply 210 and battery 230 are gradually approaching one another. In this regard, to achieve constant current charging, a change in the duty cycle of the pulse-width voltage modulation $V_{PWM}$ will compensate for the change in the battery voltage and the supply voltage.

For example, during the constant current charging period, the voltage across the battery 220 ($V_{Charge}$) is approximately equal to the supply voltage ($V_{Supply}$) times the duty cycle DC (expressed as a value from 0-1) of the voltage $V_{PWM}$, i.e., $V_{Charge}=V_{Supply}\times DC$. The charging current ($I_{Charge}$) that flows into the battery 220 is approximately equal to:

$$I_{Charge} = \frac{V_{Charge} - V_{Battery}}{R_{Series}}.$$

In this equation, $R_{Series}$ denotes the series resistance in the complete loop from the positive terminal of the power source 210, through node N1 to the battery 220, through L1, through the power MOSFET switch 230, and back to the negative terminal of the power source 210, including any effective series resistance of the power source 210 itself.

From this equation, it can be seen that to attain a constant charging current, the duty cycle DC will vary as the power supply voltage and battery voltage change during the constant charging period. The exemplary power management system 270 of FIG. 2 is configured to automatically adjust the duty cycle of the voltage $V_{PWM}$ that is generated at the output of the comparator 260 to achieve a constant current charging. In other embodiments, the functionalities of the power management system 270 can be implemented using a microcontroller which is configured to monitor the power supply voltage and voltage across the battery and generate the control voltage $V_{PWM}$ with a variable duty cycle to achieve, e.g., constant current charging (via the above equations), and other functions as discussed herein.

Figure 8:
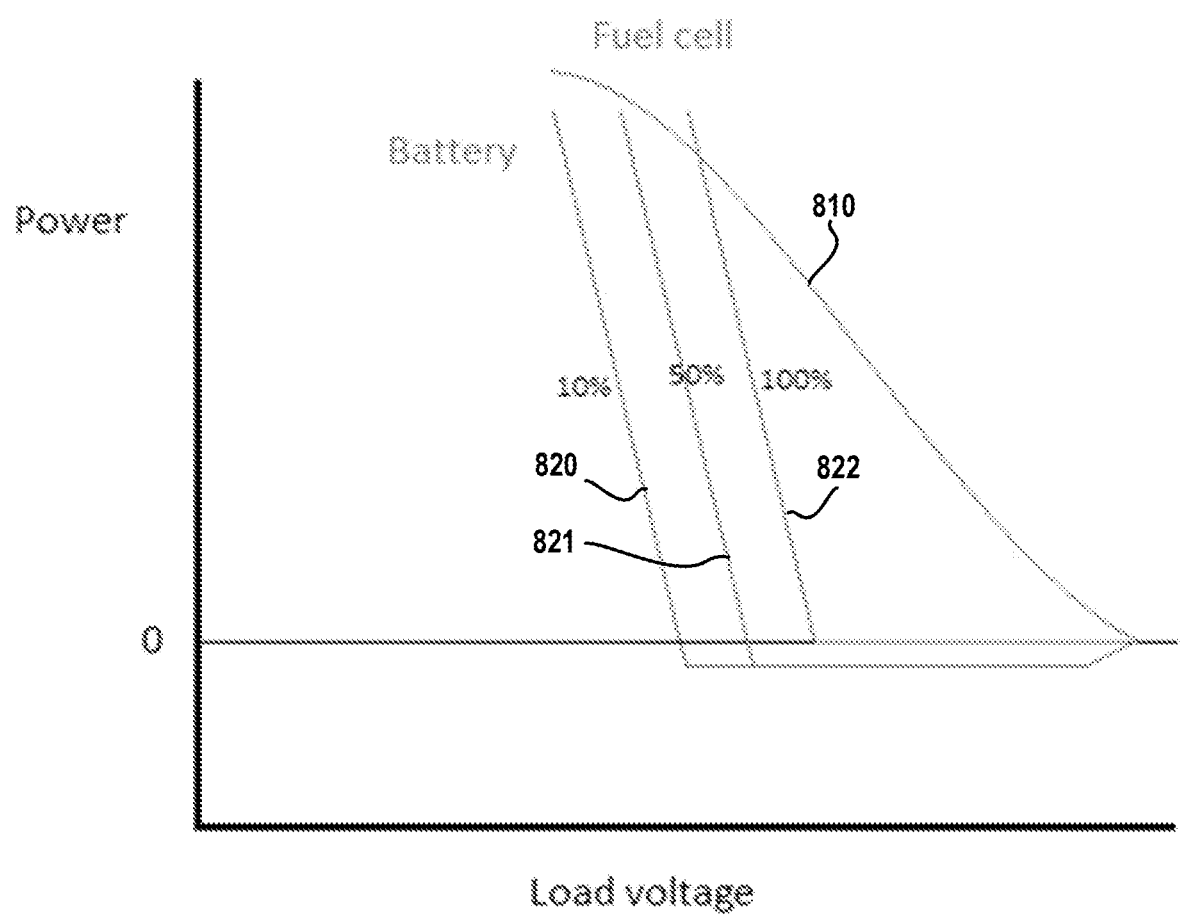
FIG. 8 graphically illustrates power contributions of a power source and an energy storage device of a hybrid power system as a function load voltage for different charge states of the energy storage device, according to an exemplary embodiment of the disclosure.

FIG. 8 graphically illustrates power contributions of a power source and an energy storage device of a hybrid power system as a function load voltage for different charge states of the energy storage device, according to an exemplary embodiment of the disclosure. More specifically, FIG. 8 comprises a graph 800 which illustrates power contributions of battery and fuel cell as a function of load voltage at 10%, 50%, and 100% battery state of charge, wherein a curve 810 illustrates a power contribution of a fuel cell as a function of increasing load voltage, and curves 820, 821, and 822 illustrate a power contribution of a battery at battery charge states of 10%, 50%, and 100%, respectively. FIG. 8 shows that under low load conditions, the fuel cell supplies all the load power. As the load increases (and voltage decreases), the battery begins to contribute power to the load (initially at 100% charge state). For example, battery voltage may vary between 50V and 40V, the fuel cell voltage may vary between 60 and 40V, and the load voltage may vary between 60V and 40V. As the battery discharges, the load voltage decreases, and the fuel cell power increases. During operation, a dynamic load change is expected. In some cases, if the load demand is low, load voltage increases and the power output from the fuel cell supplies all the load demand and charges the battery.

The variable voltage hybrid power systems as discussed herein provide reduced-weight power systems with increased electrical efficiency. Because the flow of power between the fuel cell, battery, and load occurs passively, the system responds instantly to sudden changes, such as load spikes. For example, this operating feature allows an aerial vehicle (e.g., drone) to maintain a stable flight in high wind conditions. The automatic crossover is also important for safely operating the fuel cell, which exhibits a non-monotonic power vs current curve. The battery prevents the fuel cell from entering the unstable regime, which in combination with a constant-power load would cause the fuel cell stack voltage to drop to near 0 V and damage the fuel cell by effectively applying a reverse potential to one or more underperforming cells. Fuel cell manufacturers sometimes recommend placing batteries in parallel with diodes to perform this function. That approach would not be ideal because the batteries would never charge (only discharge), and the discharge paths of both the batteries and the fuel cell would incur power losses from the forward voltage drop of the diodes.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
   a positive power supply node and a negative power supply node configured for connection to a load;
   a fuel cell coupled between the positive power supply node and the negative power supply node;
   a battery;

a solid-state switch, wherein the battery and the solid-state switch are connected in series in a current path between the positive power supply node and the negative power supply node; and an analog control system; and wherein the analog control system is configured to generate a control signal that is applied to a gate terminal of the solid-state switch to control activation and deactivation of the solid-state switch to (i) allow the battery to be discharged and supply power to the load when connected to the positive and negative power supply nodes, and to (ii) modulate an amount of charging current that flows in the current path through the battery from the fuel cell to recharge the battery;

wherein the analog control system comprises:

a voltage monitoring circuit configured to determine a voltage level of the battery, and generate a first control signal based on the determined voltage level;

a current sensor configured to sense magnitude and direction of current flow between the battery and the solid-state switch, and generate a second control signal based on the sensed magnitude and direction of the current flow between the battery and the solid-state switch; and a switch controller configured to receive the first and second control signals, and generate the control signal which comprises a pulse-width modulated control signal with a varying duty cycle, based on the first and second control signals;

wherein the voltage monitoring circuit comprises:

a differential amplifier comprising a first input terminal coupled to a positive terminal of the battery, and a second input terminal coupled to a negative terminal of the battery; and an operational amplifier comprising a first input terminal coupled to an output of the differential amplifier, and a second input terminal configured to receive as input a first threshold voltage;

wherein the operational amplifier is configured to compare an output voltage of the differential amplifier with the first threshold voltage and generate the first control signal based on the comparison.

2. The system of claim 1, further comprising:

an inductor which comprises a first terminal coupled to a terminal of the battery, and a second terminal coupled to a first source/drain terminal of the solid-state switch; and a diode having an anode terminal coupled to the second terminal of the inductor, and a cathode terminal coupled to the positive power supply node;

wherein the inductor is configured to suppress current spikes in the current path, when the solid-state switch is activated; and wherein the diode is configured to turn on and conduct current to dissipate stored energy of the inductor, when the solid-state switch is deactivated.

3. The system of claim 1, wherein the solid-state switch comprises a high-power MOSFET (metal-oxide-semiconductor field-effect transistor) device.

4. The system of claim 1, wherein the control signal generated by the analog control system comprises a pulse-width modulated control signal with a varying duty cycle, which is applied to a gate terminal of the solid-state switch to control the activation and deactivation of the solid-state switch.

5. The system of claim 1, wherein the current sensor comprises a Hall-Effect current sensor.

6. The system of claim 1, wherein the switch controller comprises:

an oscillator circuit configured to generate a pulse-width modulated voltage signal based, at least in part, on the first and second control signals; and a gate driver circuit configured to generate the pulse-width modulated control signal to drive the solid-state switch, based on the pulse-width modulated voltage signal.

7. The system of claim 6, wherein the oscillator circuit comprises:

an operational amplifier comprising a first input terminal, a second input terminal, and an output terminal;

a capacitor having a first terminal coupled to the first input terminal of the operational amplifier, and a second terminal coupled to a DC power supply bus;

wherein the first input terminal of the operational amplifier is coupled to an output of the voltage monitoring circuit and to an output of the current sensor; and wherein the second input terminal is configured to receive as input a second threshold voltage.

8. A system, comprising:

a positive power supply node and a negative power supply node configured for connection to a load;

a fuel cell coupled between the positive power supply node and the negative power supply node;

a battery;

a solid-state switch, wherein the battery and the solid-state switch are connected in series in a current path between the positive power supply node and the negative power supply node; and an analog control system; and wherein the analog control system is configured to generate a control signal that is applied to a gate terminal of the solid-state switch to control activation and deactivation of the solid-state switch to (i) allow the battery to be discharged and supply power to the load when connected to the positive and negative power supply nodes, and to (ii) modulate an amount of charging current that flows in the current path through the battery from the fuel cell to recharge the battery;

wherein the analog control system comprises:

a voltage monitoring circuit configured to determine a voltage level of the battery, and generate a first control signal based on the determined voltage level;

a current sensor configured to sense magnitude and direction of current flow between the battery and the solid-state switch, and generate a second control signal based on the sensed magnitude and direction of the current flow between the battery and the solid-state switch; and a switch controller configured to receive the first and second control signals, and generate the control signal which comprises a pulse-width modulated control signal with a varying duty cycle, based on the first and second control signals;

wherein the switch controller comprises:

an oscillator circuit configured to generate a pulse-width modulated voltage signal based, at least in part, on the first and second control signals; and a gate driver circuit configured to generate the pulse-width modulated control signal to drive the solid-state switch, based on the pulse-width modulated voltage signal;

wherein the oscillator circuit comprises:

an operational amplifier comprising a first input terminal, a second input terminal, and an output terminal;

a capacitor having a first terminal coupled to the first input terminal of the operational amplifier, and a second terminal coupled to a DC power supply bus;

wherein the first input terminal of the operational amplifier is coupled to an output of the voltage monitoring circuit and to an output of the current sensor; and wherein the second input terminal is configured to receive as input a second threshold voltage.

9. A method, comprising:

utilizing a fuel cell to supply power to a load;

in response to an increase in power demand by the load, utilizing a battery to supply power to the load in conjunction with the fuel cell;

in response to a decrease in power demand by the load:

utilizing the fuel cell to supply power to the load;

utilizing the fuel cell to supply charging current to charge the battery toward a target voltage level; and controlling activation and deactivation of a solid-state switch by an analog control system applying a control signal to a gate terminal of the solid-state switch to modulate the amount of charging current that is supplied to the battery to charge the battery toward the target voltage level, wherein the battery and the solid-state switch are connected in series, wherein the analog control system comprises:

a voltage monitoring circuit for determining a voltage level of the battery, and generating a first control signal based on the determined voltage level;

a current sensor for sensing magnitude and direction of current flow between the battery and the solid-state switch, and generating a second control signal based on the sensed magnitude and direction of the current flow between the battery and the solid-state switch; and a switch controller for receiving the first and second control signals, and generating the control signal which comprises a pulse-width modulated control signal with a varying duty cycle, based on the first and second control signals;

wherein the voltage monitoring circuit comprises:

a differential amplifier comprising a first input terminal coupled to a positive terminal of the battery, and a second input terminal coupled to a negative terminal of the battery; and an operational amplifier comprising a first input terminal coupled to an output of the differential amplifier, and a second input terminal for receiving as input a first threshold voltage;

wherein the operational amplifier compares an output voltage of the differential amplifier with the first threshold voltage and generates the first control signal based on the comparison.

10. The method of claim 9, further comprising maintaining the solid-state switch in a deactivated state, in response to the battery being charged to the target voltage level, to terminate the flow of charging current to the battery and thereby maintain the battery in an idle state.

11. The method of claim 9, wherein controlling the activation and deactivation of the solid-state switch by applying the control signal to the gate terminal of the solid-state switch to modulate the amount of charging current that is supplied to the battery, comprises applying a pulse-width modulated control signal to the gate terminal of the solid-state switch, wherein the pulse-width modulated control signal comprises a varying duty cycle during a charging period of the battery to provide a constant current charging period followed by a constant voltage charging period, during the charging period.

12. The system of claim 1, wherein:

the control signal comprises a pulse-width modulated control signal that is applied to the gate terminal of the solid-state switch during a charging period of the battery, the charging period comprising a constant current charging period followed by a constant voltage charging period; and the pulse-width modulated control signal comprises a varying duty cycle during the charging period of the battery to (i) generate a constant current for charging the battery during the constant current charging period, and (ii) generate a constant voltage for charging the-battery during the constant voltage charging period.

13. The system of claim 12, wherein in response to a voltage level of the fuel cell decreasing below a voltage level of the battery, the analog control system is configured to generate a pulse-width modulated control signal with a duty cycle of 1, which is applied to the gate terminal of the solid-state switch to maintain the solid-state switch in an activated state to allow the battery to be discharged and supply power to the load.

14. The system of claim 12, wherein during an idle period of the battery, the analog control system is configured to generate a pulse-width modulated control signal with a duty cycle of zero, which is applied to the gate terminal of the solid-state switch to maintain the solid-state switch in a deactivated state.

15. The system of claim 1, wherein:

the output voltage of the differential amplifier comprises a scaled voltage level of the-battery based on a scaling value; and the first threshold voltage applied to the second input terminal of the operational amplifier comprises a scaled voltage level of a maximum voltage of the battery based on the scaling value.

16. The system of claim 1, wherein:

the control signal comprises a pulse-width modulated control signal that is applied to the gate terminal of the solid-state switch during a charging period of the battery, the charging period comprising a constant current charging period followed by a constant voltage charging period; and the pulse-width modulated control signal comprises a varying duty cycle during the charging period of the battery to (i) generate a constant current for charging the battery during the constant current charging period, and (ii) generate a constant voltage for charging the-battery during the constant voltage charging period.

17. The system of claim 16, wherein in response to a voltage level of the fuel cell decreasing below a voltage level of the battery, the analog control system is configured to generate a pulse-width modulated control signal with a duty cycle of 1, which is applied to the gate terminal of the solid-state switch to maintain the solid-state switch in an activated state to allow the battery to be discharged and supply power to the load.

18. The system of claim 16, wherein during an idle period of the battery, the analog control system is configured to generate a pulse-width modulated control signal with a duty cycle of zero, which is applied to the gate terminal of the solid-state switch to maintain the solid-state switch in a deactivated state.

19. The method of claim 9, wherein the switch controller comprises:

an oscillator circuit for generating a pulse-width modulated voltage signal based, at least in part, on the first and second control signals; and a gate driver circuit for generating the pulse-width modulated control signal to drive the solid-state switch, based on the pulse-width modulated voltage signal.

20. The method of claim 19, wherein the oscillator circuit comprises:
an operational amplifier comprising a first input terminal, a second input terminal, and an output terminal;
a capacitor having a first terminal coupled to the first input terminal of the operational amplifier, and a second terminal coupled to a DC power supply bus;
wherein the first input terminal of the operational amplifier is coupled to an output of the voltage monitoring circuit and to an output of the current sensor; and
wherein the second input terminal receives as input a second threshold voltage.

* * * * *